(12) United States Patent
Kumaria et al.

(10) Patent No.: US 11,764,727 B2
(45) Date of Patent: Sep. 19, 2023

(54) PHOTOVOLTAIC PANEL DESIGN TO ENABLE LOW VOLTAGE AND HIGH OUTPUT POWER IN AN ENERGY GENERATING PHOTOVOLTAIC SYSTEM

(71) Applicant: Xponent Power Inc., Fremont, CA (US)

(72) Inventors: Shashwat Kumaria, San Jose, CA (US); Rohini Raghunathan, Fremont, CA (US); Vivek Phanse, San Mateo, CA (US); Miguel Martinho Lopes Praca, Cascais (PT)

(73) Assignee: Xponent Power, Inc., Fremont, CA (US)

( * ) Notice: Subject to any disclaimer, the term of this patent is extended or adjusted under 35 U.S.C. 154(b) by 97 days.

(21) Appl. No.: 17/153,878

(22) Filed: Jan. 21, 2021

(65) Prior Publication Data

US 2022/0231637 A1     Jul. 21, 2022

(51) Int. Cl.
*H02S 40/36*     (2014.01)
*H01L 31/05*     (2014.01)

(52) U.S. Cl.
CPC .......... *H02S 40/36* (2014.12); *H01L 31/0508* (2013.01)

(58) Field of Classification Search
CPC .......... H02S 40/36; H02S 40/30; H02S 40/34; H01L 31/05; H01L 31/046; H01L 31/0504
See application file for complete search history.

(56) References Cited

U.S. PATENT DOCUMENTS

| | | | |
|---|---|---|---|
| 2012/0060895 A1* | 3/2012 | Rubin | H01L 31/0504 136/246 |
| 2012/0312347 A1* | 12/2012 | Buettner | H01L 31/05 136/244 |

\* cited by examiner

*Primary Examiner* — Christina Chern
(74) *Attorney, Agent, or Firm* — Law Office of John Stattler

(57) ABSTRACT

A solar system comprises at least one solar panel with a plurality of solar cells. The solar panels include first and second split-circuits to extract electrical energy from the solar panel. The first split-circuit includes solar panel wires that electrically connect, in series, the solar cells of the first split-circuit to extract electrical energy from the solar panel. Similarly, the second split-circuit includes solar panel wires that electrically connect, in series, the solar cells of the second split-circuit to extract electrical energy from the solar panel. The first and second split-circuits are configured to generate a voltage not to exceed a voltage specification, such as a voltage specification of 35 volts.

14 Claims, 3 Drawing Sheets

PHOTOVOLTAIC PANEL DESIGN TO ENABLE LOW VOLTAGE AND HIGH OUTPUT POWER IN AN ENERGY GENERATING PHOTOVOLTAIC SYSTEM

FIELD OF THE INVENTION

This application is related to the field of expandable solar power generating systems. More specifically, this application relates to a novel photovoltaic panel design within an expandable solar system to enable operation of the solar system within a safe range of operating voltages.

BACKGROUND

The following description includes information that may be useful in understanding the disclosure set forth herein. It is not an admission that any of the information provided herein is prior art or relevant to the presently claimed invention, or that any publication specifically or implicitly referenced is prior art.

All publications herein are incorporated by reference to the same extent as if each individual publication or patent application were specifically and individually indicated to be incorporated by reference. Where a definition or use of a term in an incorporated reference is inconsistent or contrary to the definition of that term provided herein, the definition of that term provided herein applies and the definition of that term in the reference does not apply.

Many buildings, vehicles (such as recreational vehicles), pergolas, and boats use visors, awnings, shade screens, canopies or blinds to protect against solar radiation, provide shade and keep buildings or vehicles cool.

Incorporating solar generation capabilities on these shade-providing structures is advantageous because it provides the dual benefit of blocking sunlight while simultaneously using that impinging sunlight to generate electrical power.

As an example, vehicles such as RVs, use awnings for shade. Users of RVs also have a strong need for clean and silent off-grid power that enables the use of RVs in remote locations for extended periods of time.

Traditionally, solar panels are installed on roofs of RVs, but roofs typically have very limited available area for panel installation due to the presence of an air conditioner, air conditioner vents, bathroom vents, refrigerator vent, bathroom skylights, etc. at different locations on the roof.

This lack of available roof area greatly limits the number of solar panels that can be installed on a given roof, and hence the total amount of power generated by the installed solar system.

The present disclosure sets forth embodiments of a solar awning, such as for use in an RV, that overcome the above-mentioned constraints.

DETAILED DESCRIPTION

The photovoltaic panel and the novel layout and interconnection schemes disclosed herein may be equally used in static (fixed) photovoltaic systems, as well as expandable and retractable solar structures that are within close proximity of human beings and therefore accessible by touch.

A solar system integrated into structures such as awnings, shade screens, and canopies is in relatively close proximity to human contact. Hence, there is a need to maintain low (safe) voltage output from a solar awning. But there is also a need to maximize total power of the awning, which effectively results in an increase in the total number of solar panels.

Increase in the total number of panels results in a correspondingly increase of the number of panels that are electrically connected in series in a given electrical 'string' of panels, hence increasing the string voltage.

Both of the above-mentioned needs for low voltage and more power can only be met by reducing the number of panels electrically connected in series in a given electrical string, and correspondingly increasing the number of electrical strings in the awning.

However, an increase in the number of strings results in a corresponding increase in number of wires in the solar system.

An increase in the number of wires requires more space for wire management within the awning, but there is a strong constraint on the amount of available space in the awning due to the highly compact and retracting nature of the awning; thereby severely constraining the number of wires that can be accommodated in the design. For example, such awnings are described in U.S. Pat. No. 10,560,050, entitled "Innovative Energy Generating Photovoltaic Awning", and U.S. patent application Ser. No. 16/932,751, entitled "Energy Generating Photovoltaic Awning with Scissor Mechanism and Tilting Photovoltaic Panels", both assigned to the applicant of the present application, EvoluSun, Inc., and are both expressly incorporated herein by reference in their entirety.

The embodiments disclosed herein overcome the above constraints; and results in a low voltage without sacrificing the total output power of the awning.

In some embodiments, the awning solar system is comprised of a plurality of solar sub-systems which in turn comprise of a plurality of solar panels.

Figure 1:
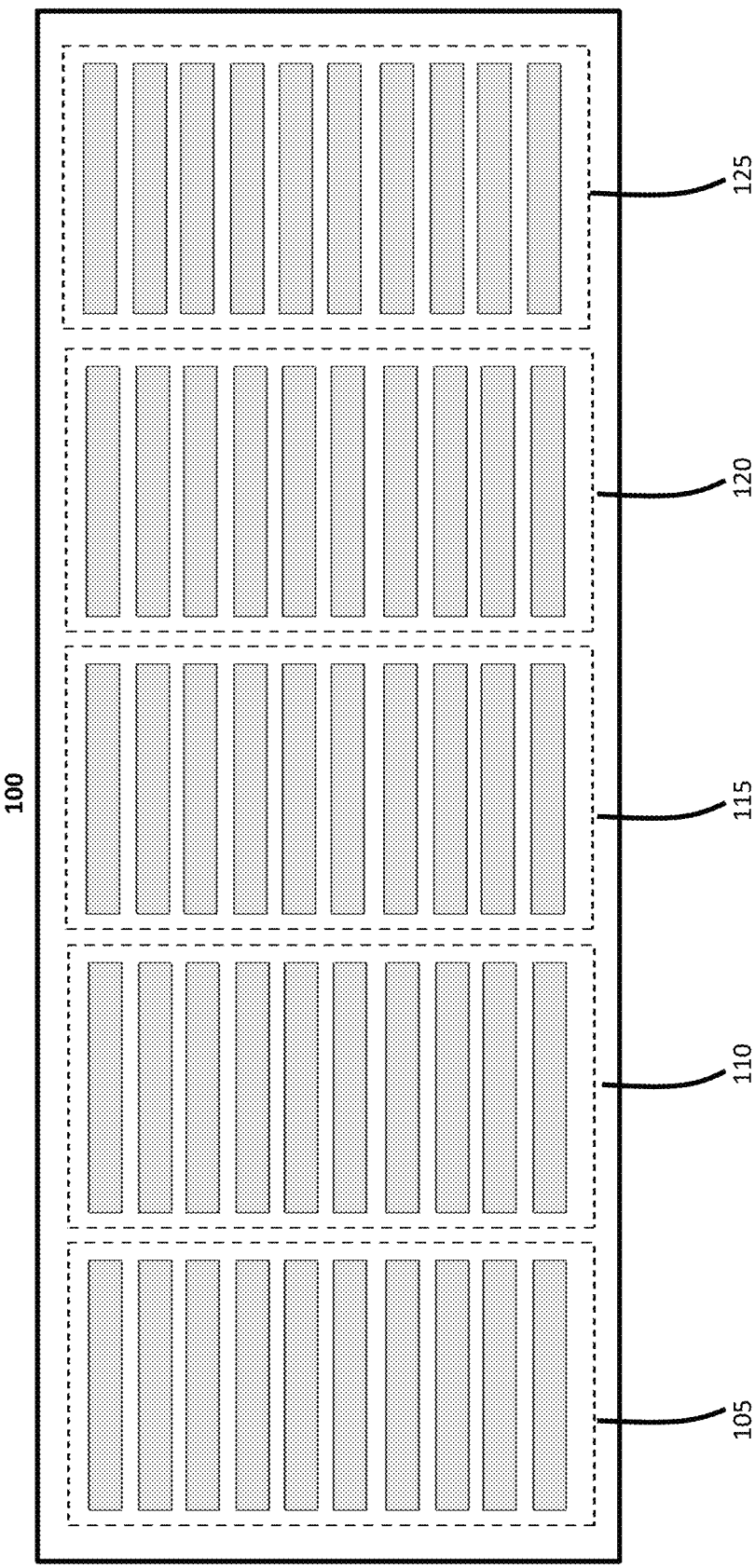
FIG. 1 illustrates one embodiment of a layout of a solar system and the sub-systems within the solar system.

In some embodiments, solar panels are grouped into mechanical modular sub-systems such that each sub-system is comprised of a plurality of solar panels, and sub-systems are placed next to one another. For the embodiment shown in FIG. 1, solar system (400) consists of subsystems 100, 150, 200, 250 and 300. Although FIG. 1 illustrates a solar system with 5 subsystems, any number of subsystems may be incorporated into a system without deviating from the spirit or scope of the invention.

Each sub-system is further comprised of two or more solar strings; and each string consists of a plurality of solar panels connected serially to form an electrical circuit.

The present disclosure sets forth herein a solar panel design that comprises of two separate and independent solar electrical circuits housed within a single solar panel; henceforth referred to a split-circuit panel.

A split-circuit panel offers the unique advantage of reducing the voltage output of a solar panel by half while not impacting the total power output, and also not impacting the mechanical support structure to which the panels are connected.

Furthermore, because each of the two independent solar cell circuits within the solar panel is electrically connected to a bypass diode which ensures protection of individual solar cells against reverse-bias conditions that can arise due to multiple reasons while in operation; another benefit of the split-circuit panel is the reduction in number of solar cells per bypass diode to half of those in a standard solar panel that comprises of only one solar cell circuit. This leads to an inherently more robust solar panel that is more adaptive to a solar cell reverse bias condition. Another benefit of a split-circuit design is the simplification of the mechanical and electrical assembly of solar panels within a mechanical enclosure, and also the reduction in the unique number of mechanical components needed to mount the solar panels. Mechanically speaking, the solar panel can use the same mechanical mounting components on a given short side of the solar panel because a junction box will always be present on the short side even if the solar panel is rotated 180 degrees to move the right slide to the left and the left side to the right.

Electrically, this simplification results from the rotational symmetry of the electrical circuit layout within the solar panel. Specifically, the solar panel can rotated by 180 degrees around the center of the panel, and the resulting new mechanical orientation has the same location of the positive and negative terminals as the original orientation.

Yet another benefit that results from the mechanical and electrical simplification of the solar panel design is the reduced error in assembly of the solar panels, because a specific orientation of the solar panels is not required to achieve correct assembly.

Figure 3:
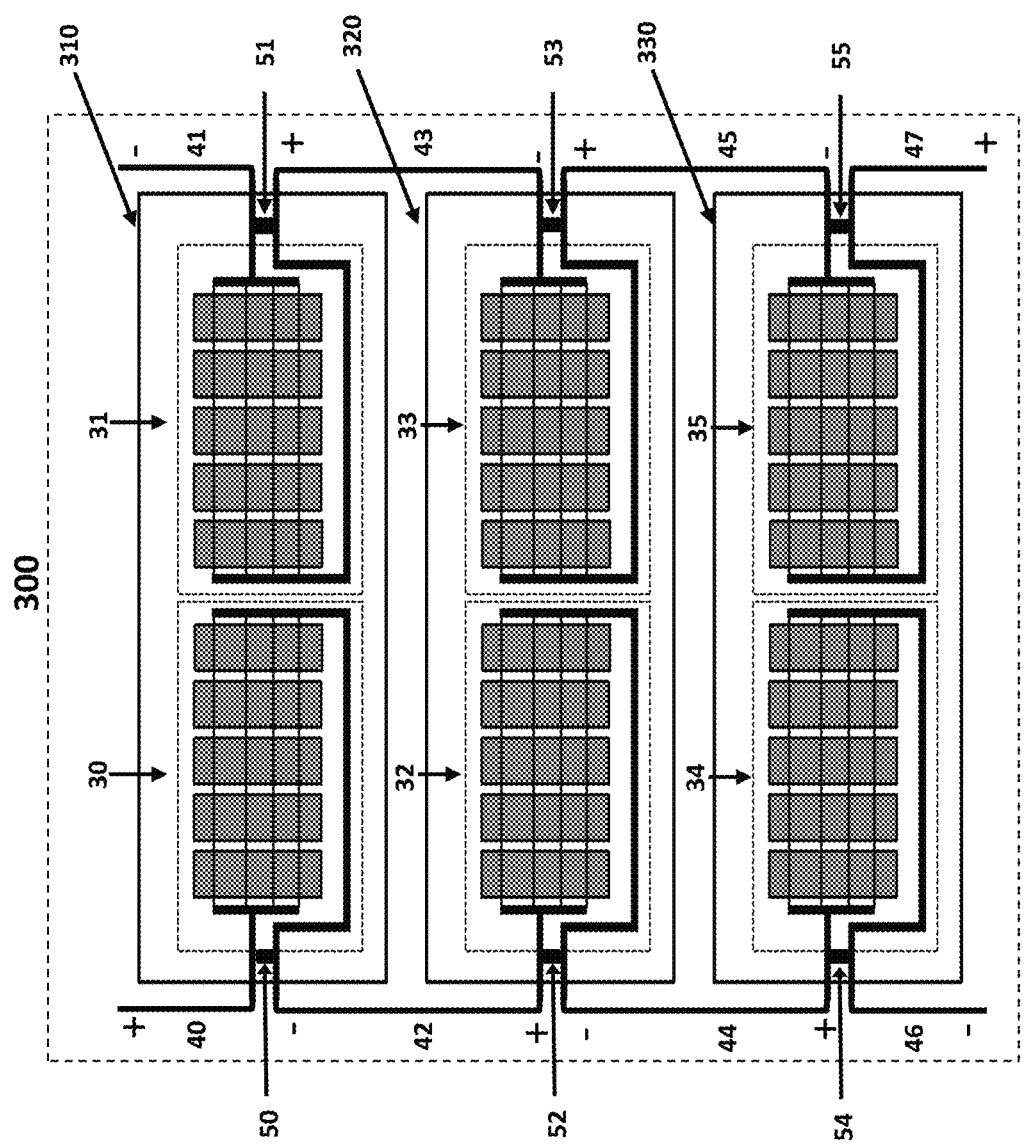
FIG. 3 illustrates a sub-set of solar panels in one sub-system that are interconnected to form two separate and independent electrical strings

In one embodiment, a sub-system comprised of plurality of split-circuit solar panels are connected in series on either side of a solar panel to create two independent electrical strings from a set of solar panels (See FIG. 3)

Moving to a detailed description of the FIGs; FIG. 1 shows a schematic of a solar system (100) comprising of sub-systems (105, 110, 115, 120, and 125) with a plurality solar panels inside each sub-system.

Figure 2:
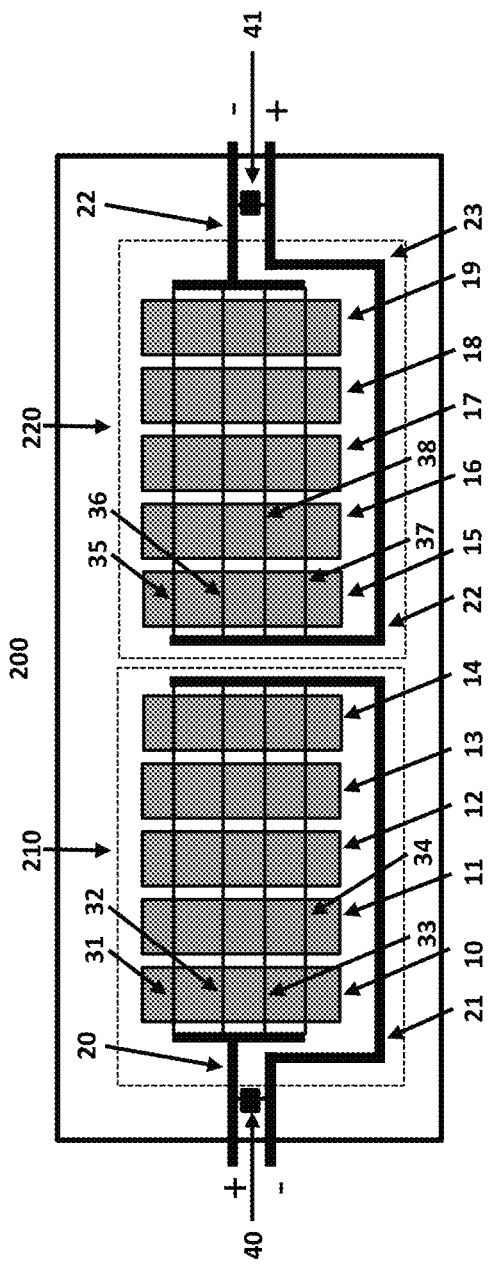
FIG. 2 illustrates a solar panel with two separate and independent electrical solar circuits

FIG. 2 shows a solar panel (200) comprising of a plurality of solar cells that are interconnected to form two separate and independent electrical circuits (210, 220). One circuit (210) has positive and negative terminals (20, 21) terminating on the left side of the solar panel; and the other circuit (220) has the positive and negative terminals (22, 23) terminating on the right side of the solar panel.

Circuit 210 of FIG. 2 is shown as comprising of a plurality of solar cells (10, 11, 12, 13, 14) that are interconnected with a plurality of electrically conducting connectors (31, 32, 33, 34). A bypass diode (40) is connected across the electrical terminals of circuit 210.

Similarly, the second circuit (220) is shown as comprising of a plurality of solar cells (15, 16, 17, 18, 19) that are interconnected with a plurality of electrically conducting connectors (35, 36, 37, 38). A bypass diode (41) is connected across the electrical terminals of circuit 220.

FIG. 3 shows an embodiment for interconnection of electrical circuits across a plurality of solar panels. In this embodiment, the solar panels (310, 320, 330) are electrically connected. Circuit 30 in solar panel 310, circuit 32 in solar panel 320, and circuit 34 in solar panel 330 are connected to form one electrical string. Circuit 31 in solar panel 310, circuit 33 in solar panel 320, and circuit 35 in solar panel 330 are connected to form another electrical string. Circuit 30 is connected to circuit 32 by means of electrical conductor 42, and circuit 32 is connected to circuit 34 by means of electrical conductor 44. Similarly, circuit 31 is connected to circuit 33 by means of electrical conductor 43, and circuit 33 is connected to circuit 35 by means of electrical conductor 45. Circuits 30, 31, 32, 33, 34, and 35 respectively have bypass diodes 50, 51, 52, 53, 54, and 55 connected in parallel to solar cells comprised within the circuits.

Although the present invention has been described in terms of specific exemplary embodiments, it will be appreciated that various modifications and alterations might be made by those skilled in the art without departing from the spirit and scope of the invention.

What is claimed is:

1. A solar system comprising:
   a plurality of solar panels, wherein each of the plurality of solar panels comprise a plurality of solar cells;
   wherein at least two of the plurality of solar panels each comprise:
      a plurality of split-circuits to extract electrical energy from the at least two of the plurality of solar panel, wherein each of the plurality of split-circuits comprise a plurality of solar panel wires that electrically connect, in series, a subset of the plurality of solar cells; and
   a plurality of solar panel strings, wherein at least one of the solar panel strings couple a split-circuit from one of the at least two of the plurality of solar panels to a split-circuit from a different one of the at least two of the plurality of solar panels.

2. The solar system as set forth in claim 1, wherein at least one of the split-circuits produce a voltage of approximately 35 volts.

3. The solar system as set forth in claim 1, wherein the plurality of solar panel wires of a first split-circuit and the plurality of solar panel wires of a second split-circuit on one of the at least two of the plurality of solar panels begin and terminate at opposite ends of the one of the at least two of the plurality of solar panels.

4. The solar system as set forth in claim 1, wherein a first subset of the plurality of solar cells on one of the at least two of the plurality of solar panels is located on an end of the one of the at least two of the plurality of solar panels, and a second subset of the plurality of solar cells on the one of the at least two of the plurality of solar panels is located at the opposite end of the one of the at least two of the plurality of solar panels.

5. The solar system as set forth in claim 1, wherein the plurality of solar panel strings comprise interconnect wires to connect, in series, at least two of the plurality of split-circuits located on the at least two of the plurality of solar panels.

6. The solar system as set forth in claim 5, wherein the at least two of the plurality of split-circuits are arranged on the same side of the at least two of the plurality of solar panels.

7. The solar system as set forth in claim 6, wherein the interconnect wires of a first solar panel string and the interconnect wires from a second solar panel string begin and terminate at opposite ends of the at least two of the plurality of solar panels.

8. The solar system as set forth in claim 1, further comprising at least one sub-system that comprises a subset of the plurality of the solar panels.

9. A method for extracting energy from a solar system comprising a plurality of solar panels, wherein the plurality of solar panels comprise a plurality of solar cells, comprising:
   extracting electrical energy from a first split-circuit on a first of the plurality of the solar panels, the first split-circuit comprises a plurality of solar panel wires that electrically connect, in series, a subset of the plurality of solar cells on the first of the plurality of the solar panels;

extracting electrical energy from a second split-circuit on a second of the plurality of the solar panel, the second split-circuit comprises a plurality of solar panel wires that electrically connect, in series, a subset of the plurality of solar cells on the second of the plurality of the solar panels; and connecting the first split-circuit and the second split-circuit with a first interconnect wires, in series, to form a first solar panel string.

10. The method as set forth in claim 9, extracting electrical energy from the first and second split-circuits comprises generating a voltage of approximately 35 volts.

11. The method as set forth in claim 9, further comprising extracting electrical energy from a third split-circuit on the first of the plurality of the solar panels, the third split-circuit comprises a plurality of solar panel wires that electrically connect, in series, a subset of the plurality of solar cells on the first of the plurality of the solar panels not connected by the first split circuit;

extracting electrical energy from a fourth split-circuit on the second of the plurality of the solar panels, the fourth split-circuit comprises a plurality of solar panel wires that electrically connect, in series, a subset of the plurality of solar cells on the second of the plurality of the solar panels not connected by the second split circuit; and connecting the third split-circuit and the fourth split-circuit with a second interconnect wires, in series, to form a second solar panel string, wherein the second solar panel string and the first solar panel string are routed on opposite ends of the first and second of the plurality of solar panels.

12. The method as set forth in claim 9, wherein a first subset of solar cells and a second subset of solar cells of one of the plurality of solar panels are located on opposite ends of the one of the plurality of solar panels.

13. The method as set forth in claim 9, wherein the plurality of solar panel wires of the first split-circuit and the second split-circuit begin and terminate on the same side of the first and the second of the plurality of the solar panels.

14. The method as set forth in claim 9, further comprising at least one sub-system that comprises a subset of the plurality of the solar panels.

* * * * *